(12) United States Patent
Gerken et al.

(10) Patent No.: US 12,364,135 B2
(45) Date of Patent: Jul. 15, 2025

(54) OLED-WAVEGUIDE ASSEMBLY AND PRODUCTION METHOD THEREFOR

(71) Applicant: Christian-Albrechts-Universitaet zu Kiel, Kiel (DE)

(72) Inventors: Martina Gerken, Kiel (DE); Janek Buhl, Kiel (DE); Matthias Bremer, Regensburg (DE); Sabrina Hein, Bargstedt (DE)

(73) Assignee: Christian-Albrechts-Universitaet zu Kiel, Kiel (DE)

( * ) Notice: Subject to any disclaimer, the term of this patent is extended or adjusted under 35 U.S.C. 154(b) by 622 days.

(21) Appl. No.: 17/760,655

(22) PCT Filed: Sep. 12, 2020

(86) PCT No.: PCT/DE2020/100796
§ 371 (c)(1),
(2) Date: Mar. 15, 2022

(87) PCT Pub. No.: WO2021/052532
PCT Pub. Date: Mar. 25, 2021

(65) Prior Publication Data
US 2022/0336779 A1 Oct. 20, 2022

(30) Foreign Application Priority Data
Sep. 17, 2019 (DE) ...................... 10 2019 124 950.3

(51) Int. Cl.
*H10K 59/38* (2023.01)
*H10K 50/13* (2023.01)
(Continued)

(52) U.S. Cl.
CPC ........... *H10K 59/38* (2023.02); *H10K 50/131* (2023.02); *H10K 50/816* (2023.02); *H10K 50/858* (2023.02); *H10K 59/879* (2023.02)

(58) Field of Classification Search
CPC .. H10K 50/131; H10K 50/816; H10K 50/858; H10K 59/38; H10K 59/879
(Continued)

(56) References Cited

U.S. PATENT DOCUMENTS 5,881,089 A * 3/1999 Berggren ................ H01S 3/168
372/7
2009/0015142 A1 1/2009 Potts et al.
(Continued)

FOREIGN PATENT DOCUMENTS

| EP | 0878883 A1 | 11/1998 |
|---|---|---|
| JP | 2013191464 A | 9/2013 |
| WO | 2017053855 A1 | 3/2017 |

OTHER PUBLICATIONS

International Search Report issued on Jan. 27, 2021, in International Application No. PCT/DE2020/100796.

*Primary Examiner* — Fazli Erdem
(74) *Attorney, Agent, or Firm* — Stephan A. Pendorf; Patent Central LLC

(57) ABSTRACT

An OLED waveguide assembly including an organic light emitting diode assembly, a waveguide layer and a substrate. The organic light emitting diode assembly is separated from the waveguide layer by a spacer layer, and the organic light emitting diode assembly has a maximum emission at a wavelength of 470 nanometers. The waveguide layer is nanostructured. The substrate has pixel-dependent nanostructures with a lattice constant of approximately 400±50 nanometers, suitable for the emissions of the waveguide layer. The waveguide layer or a layer situated in front of the waveguide has the function of a wavelength converter having a maximum absorption at 470 nanometers and having a maximum emission at 620 nanometers. The lattice structure does not match the emission of the installed OLED. Ideally, all of the primary light is converted or any residual
(Continued)

is filtered out. Further an OLED-waveguide assembly production method.

9 Claims, 1 Drawing Sheet

(51) Int. Cl.
*H10K 50/816* (2023.01)
*H10K 50/858* (2023.01)
*H10K 59/80* (2023.01)

(58) Field of Classification Search
USPC .......................................................... 257/40
See application file for complete search history.

(56) References Cited

U.S. PATENT DOCUMENTS

| | | | |
|---|---|---|---|
| 2009/0051271 A1 | 2/2009 | Birnstock et al. | |
| 2010/0054291 A1* | 3/2010 | Yukawa | H01S 3/168 |
| | | | 372/39 |
| 2017/0084874 A1* | 3/2017 | Baker | H10K 50/854 |
| 2017/0110688 A1* | 4/2017 | Slafer | H10K 59/875 |
| 2017/0301888 A1 | 10/2017 | Lamansky et al. | |
| 2018/0047944 A1 | 2/2018 | Lamansky et al. | |
| 2021/0305539 A1* | 9/2021 | Chowdhury | H10K 50/854 |
| 2021/0408761 A1* | 12/2021 | Scheller | H01S 5/1833 |

* cited by examiner

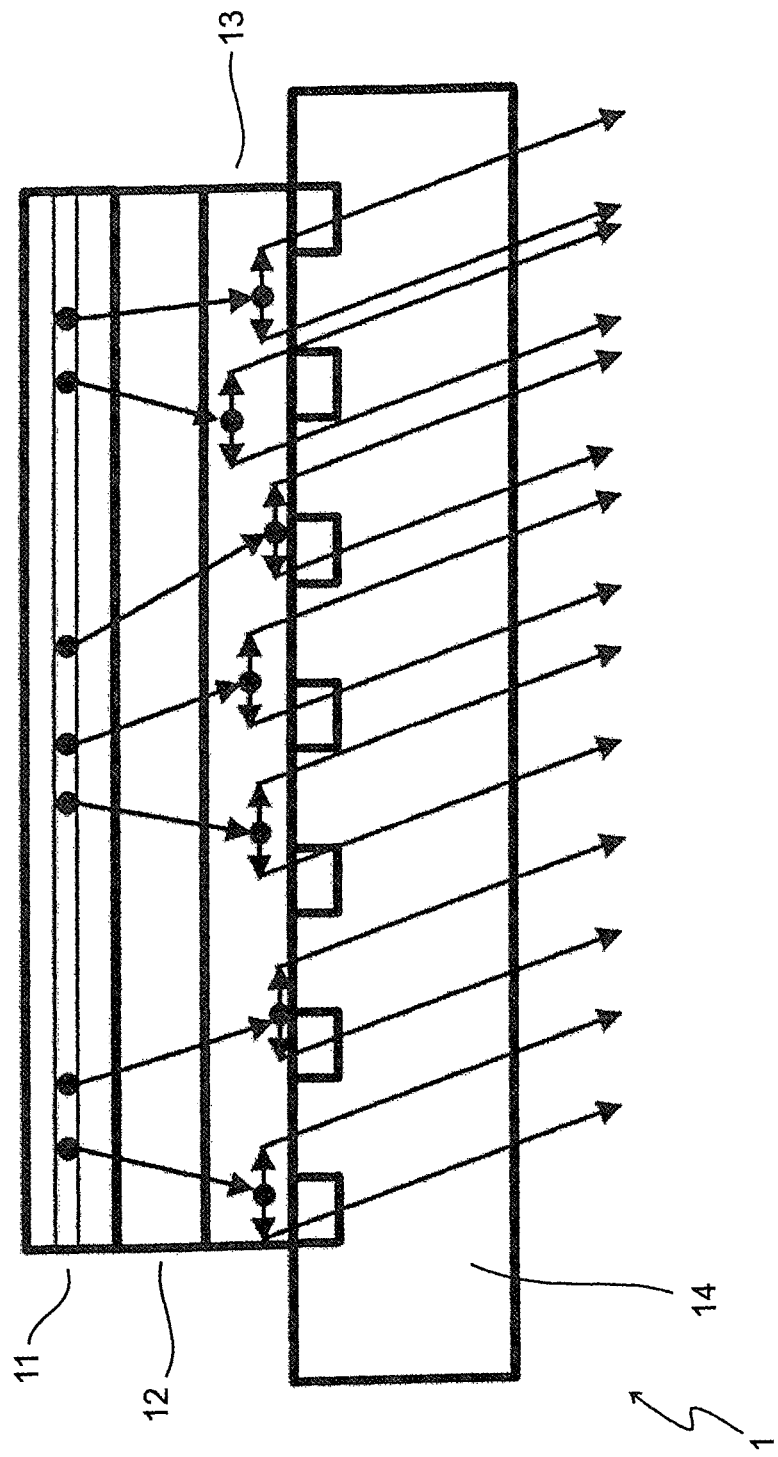

OLED-WAVEGUIDE ASSEMBLY AND PRODUCTION METHOD THEREFOR

BACKGROUND OF THE INVENTION

Field of the Invention

The invention relates to an OLED waveguide assembly (1) with an organic light-emitting diode assembly (11), a waveguide layer (13) and a substrate (14), the organic light-emitting diode assembly (11) being separated from the waveguide layer by a spacer layer (12), and the organic light-emitting diode assembly (11), the spacer layer (12), the waveguide layer (13) and the substrate (14) being materially connected to one another in a layer stack and the emission of the organic light-emitting diode assembly (11) having a maximum emission at a wavelength around 470 nanometers.

Furthermore, the invention relates to an OLED waveguide assembly production method for a corresponding OLED waveguide arrangement according to the invention.

The organic light emitting diode assembly/OLED is separated from the luminescent layer by a spacer layer. The waveguide layer is nanostructured and either consists of luminescent material itself or has a layer of luminescent material placed in front of it. The light-emitting material in the luminescent part of the waveguide layer is optically excited by the radiation from the organic light-emitting diode array. The nanostructure of the waveguide layer is used for directional radiation.

Description of the Related Art

OLEDs with a directional emission characteristic have great potential for the realization of cost-effective, integrated light sources, e.g. for biosensor technology or for switchable surface properties.

Furthermore, directed emission enables autostereoscopic displays with high resolution and offers new approaches for data transmission with visible light communication (VLC).

From the prior art an arrangement is disclosed in which an OLED is connected to a luminescence layer via a layer stack, namely in the publication US 2009/0051271 A1 an OLED is described having a transparent electrode which is additionally covered with a luminescence layer. In this case, the luminescence layer is used as a wavelength converter, so that the outcoupling efficiency of an OLED can be improved.

The publication WO 2017/053855 A1 discloses an apparatus for light diffraction and an organic light-emitting diode (OLED) containing the light diffraction apparatus. A light diffraction device may include an optional planarization layer, a transparent substrate, and a waveguide layer. The planarization layer can have a refractive index of $n_s$. The transparent substrate has a refractive index of $n_g$. The waveguide layer distributed over the transparent substrate can have a refractive index $n_w$ wherein $n_w$ is greater than $n_g$ and $n_w$ is greater than $n_s$. The waveguide layer can consist of a binding matrix and at least one nanoparticle. The waveguide layer can be inserted between the transparent substrate and the optional planarization layer.

Document US 2018/0047944 A1 describes an emitting article containing an OLED with a light-emitting surface, a circular polarizer, and a light extraction film that is optically located between the OLED and the circular polarizer and is optically coupled to the light-emitting surface. The light extraction film includes a two-dimensionally structured layer of extraction elements having a first index of refraction and a spacing in a range of 400 to 800 nm and a backfill layer including a material having a second index of refraction different from the first index of refraction.

Document US 2009/0015142 A1 discloses a multifunctional optical film to improve light extraction, a flexible substrate, a structured layer and a backfill layer. The patterned layer effectively uses microreplicated diffractive or scattering nanostructures that are close enough to the light-generating region to allow extraction of an evanescent wave from an organic light-emitting diode (OLED) device. The backfill layer has a material with a different refractive index than the refractive index of the structured layer. The backfill layer also provides a planarizing layer over the patterned layer to conform the light extraction film to a layer of an OLED display device. The film may have additional layers added to or integrated into an emitting surface to provide additional functionality beyond improving light extraction efficiency.

US 2017/0301888 A1 discloses novel light-emitting devices, including AMOLED displays, based on a transparent OLED architecture in which a laminated nanostructured light-extraction film can produce on-axis and integrated optical gains and improved angular luminance and colors. The transparent AMOLED displays with laminated submicron extractors generally include: (a) an extractor on a transparent substrate for light extraction on both sides of the transparent device; or (b) an extractor on a reflective film to provide light extraction from the underside of the bottom-emitting (BE) AMOLED; or (c) an extractor on a light absorbing film to provide outcoupling from the bottom of the BE AMOLED in combination with improved ambient contrast.

A problem in the prior art is essentially that there is no technical solution to obtain highly directional emission from OLED light sources. For this particular purpose, the integration of nanostructures in OLEDs for the generation of directed radiation has been investigated so far. The nanostructure decouples guided modes in a directed manner. At the same time, this serves to increase the power efficiency. The disadvantage here is that the non-directional emission of the OLED is superimposed on the directional emission. Since both are in the same wavelength range, they cannot be separated. Furthermore, the absorption of the OLED layers prevents high quality factors and thus narrow emission characteristics. The use of a narrow-band emitter makes it possible to increase the proportion of directional emissions. However, this is limited to certain emitter materials and is at the expense of efficiency. As an alternative, the coupling of an OLED with a diffractive optical element (DOE) has also been proposed in order to achieve both highly directional emission and to be able to design the emission characteristics through the DOE, although this approach does not enable the direct directional emission of an OLED pixel, but requires additional space. In a further approach, the combination of two OLEDs lying one on top of the other is proposed in order to be able to adjust the emission characteristics and also change them over time. This entails a more complex structure and highly directional emission has not yet been demonstrated.

According to the state of the art as described in the above discussed publications, no OLED waveguide arrangement is known from which organic structures are used to form the spacer layer and the waveguide layer and a grating structure is used which matches the wavelength of the secondary light but does not match the wavelength of the primary light.

BRIEF SUMMARY OF THE INVENTION

The present invention is based on the object of providing an OLED waveguide arrangement and an associated production method, wherein the OLED waveguide arrangement should in particular have a highly directional emission characteristic.

This object is achieved with an OLED waveguide arrangement according to the main claim and an OLED waveguide arrangement production method for an OLED waveguide arrangement according to the further independent claim.

The OLED waveguide assembly comprises an organic light emitting diode assembly, a waveguide layer and a substrate, wherein
  the organic light emitting diode assembly is separated from the waveguide layer by a spacer layer and
  the organic light-emitting diode assembly, the spacer layer, the waveguide layer and the substrate are materially interconnected in a layer stack and
  the organic light-emitting diode arrangement has a maximum emission at a wavelength of around 470 nanometers,
wherein
  the waveguide layer is nanostructured,
  the waveguide layer and the spacer layer are formed of organic material
  the spacer layer is transparent to the light from the organic light emitting diode assembly and the light from the waveguide layer,
  the organic light-emitting diode arrangement is designed as a primary light source,
  the substrate has pixel-dependent nanostructures on the surface, which have a lattice constant of approximately 400±50 nanometers, matching the emissions of the waveguide layer,
  the spacer layer has a layer thickness of 300 to 500 nanometers,
where
  the waveguide layer
    itself consists of luminescent material
    or
    has layer of luminescent material situated in front,
and
  the waveguide layer or the layer situated in front of the waveguide has the function of a wavelength converter has a maximum absorption at 470 nanometers and has a maximum emission at 620 nanometers.

In the OLED waveguide arrangement according to the invention, an OLED generates a primary light which subsequently reaches a luminescent waveguide layer at a distance of 300 to 500 nanometers, where it generates a luminescent light (secondary light). The spacer layer is transparent both for the OLED and for the waveguide layer and serves to prevent the reabsorption of the secondary light by the OLED. The waveguide layer is structured periodically in such a way that it has narrow emission characteristics for the secondary light. The primary light has a wavelength of approximately 470 nanometers and the secondary light has a wavelength of approximately 620 nanometers. The lattice constant is 400+/−50 nanometers and is therefore not suitable for the primary light.

The use of a lattice structure that does not match the emission of the installed OLED is new and inventive. Ideally, all of the primary light is converted or any residual is filtered out. The secondary light is emitted in a directed manner with a wavelength of 620 nanometers. In addition, both the OLED, as well as the waveguide layer and spacer layer, can be formed from organic material.

According to the invention, the OLED waveguide arrangement consists in an alternative embodiment of an organic light-emitting diode arrangement, a waveguide layer and a substrate, wherein the layers are materially connected to one another in a layer stack, the organic light-emitting diode arrangement being separated from the luminescent layer by a spacer layer, the waveguide layer being nanostructured and the waveguide layer itself consisting of luminescent material or has a layer of luminescent material situated in front of the waveguide.

In a preferred configuration, the waveguide layer can have the nanostructuring at least on the side facing the substrate.

The waveguide layer can preferably be completely nanostructured.

In one embodiment, the substrate can form the outer side of the arrangement on the light exit surface.

If the layer situated in front of the waveguide consists of luminescent material, then this takes over the function of the wavelength converter.

An additional wavelength-selective (dichroic) layer and/or a long-pass filter can be integrated on the light exit surface in the layer stack.

The nanostructures on the waveguide layer can in particular be designed pixel by pixel, with the nanostructures on the waveguide layer being identical pixel by pixel or being slightly different pixel by pixel.

The organic light-emitting diode arrangement serves as the primary light source and can be designed in the form of thin, partially transparent metal layers and/or conductive polymers and/or poly-3,4-ethylenedioxythiopene and/or polystyrene sulfonate with carbon nanotubes.

Furthermore, the refractive index of the waveguide layer can preferably be higher than that of the substrate and spacer layer.

The luminescent material of the waveguide layer can preferably have a layer thickness at which the primary light is almost completely absorbed.

The waveguide layer and/or spacer layer are preferably formed from:
(2-{(E)-2-[4-(dimethylamino)phenyl]vinyl}-6-methyl-4H-pyran-4-ylidene)malononitrile for doping in polyvinylcarbazole
and/or
tris-(4,7-diphenyl-1,10-phenanthropon)ruthenium (II) dichloride in polymethyl methacrylate and/or
Super Yellow as a polymer without a separate matrix.

Furthermore, at this point it should be stated in the following, in conjunction with the prior art, that the production of OLEDs with an emission maximum at approx. ~470 nm is within the skill of the person of ordinary skill in this art, namely known from, for example:
  Kim, Tae-Gu, Oh, Hwan Sool, Kim, You-Hyun, and Kim Woo-young, "Study of Deep Blue Organic light-emitting Diodes Using Doped BCzVBi with Various Blue Host Materials," Transactions on Electrical and Electronic Materials, vol. 11, no. 2, pp. 85-88, April 2010.
  Jian Liu, Minhua Jiang, Xiaoying Zhou, Changjun Zhan, Jin Bai, Min Xiong, Fenfen Li and Yuhua Liu, "High-efficient sky-blue and green emissive OLEDs based on Flrpic and FIrdfpic", Synthetic Metals, vol. 234, pp. 111-116, 2017.
  Etienne Baranoff and Basile F. E. Curchod, "Flrpic: archetypal blue phosphorescent emitter for electroluminescence", Dalton Trans., vol. 44, no. 18, pp. 8318-8329, 2015.
  Ping-I Shih, Chen-Han Chien, Chu-Ying Chuang, Ching-Fong Shu, Cheng-Han Yang, Jian-Hong Chen and Yun, "Novel host material for highly efficient blue phosphorescent OLEDs", volume 17, no. 17, pp. 1692-1698, 2007.

Salehi, A., Dong, C., Shin, D. et al., "Realization of high-efficiency fluorescent organic light-emitting diodes with low driving voltage", Nat. Commun., vol. 10, 2019.

Lee, J.-I., Lee, J., Lee, J.-W., Cho, D.-H., Shin, J.-W., Han, J.-H. and Chu, H. Y. (2012), Dependence of Light-Emitting Characteristics of Blue Phosphorescent Organic Light-Emitting Diodes on Electron Injection and Transport Materials. ETRI Journal, 34: 690-695.

The OLED waveguide assembly manufacturing method for an inventive, albeit only special OLED waveguide assembly preferably has the steps:

manufacturing a substrate with a pixel-dependent nanostructure on the surface
by injection molding in plastic or by applying a photoresist layer on the substrate and structuring with the aid of a nano-imprinting process;
applying a waveguide layer containing a photoluminescent layer by liquid phase coating or evaporation or sputtering, wherein either one material can serve both purposes or two separate materials can be used;
applying a spacer layer, which separates the active layers of the organic light emitting diode assembly from the nanostructured waveguide;
processing the organic light-emitting diode arrangement above the spacer layer from the liquid phase and/or in a vacuum process.

In detail, this means:

laying out a lower electrode of the organic light-emitting diode arrangement in a partially transparent manner and applying organic transport, blocking and emission layers to the partially transparent electrode, with the organic light-emitting diode arrangement being configured with a second metal electrode, which can preferably be made thicker and non-transparent, and wherein the upper side of the organic light-emitting diode arrangement, i.e. the side facing away from the emission of the radiation, is preferably sealed with an encapsulation made of glass or plastic.

By sealing the OLED waveguide arrangement with an encapsulation made of glass or plastic, degradation in particular by atmospheric oxygen from the top can be avoided.

Due to the layer structure of the OLED waveguide arrangement, the usual method of producing the organic light-emitting diode arrangement with indium tin oxide applied by cathode sputtering is not suitable.

The emission of the light-emitting diode arrangement should match the absorption of the photoluminescent layer, in particular in terms of wavelength.

The spacer layer separates the active layers of the organic light emitting diode assembly from the nanostructured waveguide layer. Depending on the refractive index of this layer, the layer thickness should be chosen so large that the evanescent light from the waveguide layer has decayed to a small fraction (e.g. <1%). The layer thicknesses are typically about 300-500 nm. The spacer layer should be transparent both for the luminescent light and for the light from the organic light-emitting diode arrangement.

The waveguide layer is in particular nanostructured and can either itself consist of luminescent material or can have a layer of luminescent material situated in front.

The luminescent layer has the function of a wavelength converter. Depending on the method of application to the substrate, the waveguide layer can have the nanostructure only on the underside facing the substrate, or it can be completely nanostructured. The refractive index of the waveguide layer should be higher than that of the substrate and spacer layer.

The substrate can be made of plastic or glass and have pixel-dependent nanostructures on the surface. The nanostructures can be identical pixel by pixel or slightly different. The substrate can represent at least the outer side of the arrangement on the light exit surface and thus protect the organic light-emitting diode arrangement from mechanical contact or the influence of oxygen from the underside.

It is possible to produce the entire layered structure on the nanostructured substrate in liquid-phase processes. Thus, there is a high potential for cost-effective roll-to-roll production.

Further embodiments and variants of the invention are explained below, although these are not necessarily to be regarded as restrictive:

In particular, a configuration in which the directional light is emitted through the substrate, as shown in FIG. 1, is preferable for both biosensing and display applications. The substrate represents the outer side of the arrangement with a well-defined emission characteristic and protects the organic light-emitting diode arrangement/OLED from being touched, from liquids in a microfluidic chip or from mechanical stress when the display is touched. At the same time, it protects the organic light-emitting diode array/OLED from the influence of oxygen from below.

For an integrated measurement system, several pixels should be arranged next to each other as shown in FIG. 1. The nanostructure should be designed pixel by pixel in such a way that the desired detection area in the measuring system is illuminated with the directed radiation. For a 3D display, pixels with slightly different nanostructures should also be next to each other. Changing the period slightly changes the beam angle, which can be used for an autostereoscopic display. Here, in the case of biosensor technology, it could be designed accordingly that pixels shine from different sides, for example towards a detection area. A photodetector could then be located directly below the detection area. In order to obtain the corresponding direction, lattice structures would be twisted against each other. Alternatively, one could also use a two-dimensional nanostructure such as a two-dimensional DOE to achieve beam focusing at a specific point. The usual angles must be realized for autostereoscopic displays.

For mass production, the substrate with the pixel-dependent surface nanostructures can be injection-molded in plastic.

The nanostructure of pixels is in the 10 µm to 5 mm range, with typically ~500 µm.

For prototypes and small series, a photoresist layer could be structured on the substrate (glass or plastic) using the nano-embossing process, with lattice constants or lattice periods in the range of 400 nm±50 nm (depending on the waveguide) for the photoluminescence emission, whereby this is also possible very cheaply in the roll-to-roll process. According to this, the periodic nanostructure should have lattice constants or lattice periods suitable for the secondary light.

A waveguide layer and a photoluminescence layer are also applied. Either one material can serve both purposes, or two separate materials are used. The waveguide layer, separate or combined with the luminescence layer, should have a refractive index higher than the substrate and the spacer layer.

The waveguide layer can be applied to the nanostructured substrate, for example, by liquid phase coating, by evaporation or by sputtering. With a liquid-phase coating, it can be assumed that only the bottom is nanostructured by the substrate, while the top is planarized by the coating process. In an evaporation process, the nanostructure is typically preserved through the waveguide. This waveguide layer can serve directly as a matrix layer for a photoluminescent material.

Alternatively, the waveguide layer can be coated with a photoluminescent layer.

The absorption of the layer for the OLED light should preferably be almost 100%. The photoluminescence layer could or should preferably always be designed with a sufficient thickness to completely absorb the primary light.

The waveguide or photoluminescence layer and the spacer layer can be formed from organic material (polymers). This means that the organic material of the luminescent layer can contain organic dyes.

Material examples are DCM for doping in PVC or Ru (ddp) in PMMA or Super Yellow as a polymer without a separate matrix-DCM: 4-(Dicyanomethylene)-2-methyl-6-(4-dimethylaminostyryl)-4H-pyran (English) or (2-{(E)-2-[4-(dimethylamino)phenyl]vinyl}-6-methyl-4H-pyran-4-ylidene)malononitrile (German).

Alternatively, the photoluminescent material has a high Stokes shift in order to be able to cleanly separate excitation and emission light. For this purpose, a long-pass filter is placed on the underside of the substrate. The long-pass filter can be implemented most cost-effectively as a flat film. Or the substrate directly absorbs the excitation wavelength.

In both cases, the next layer is a spacer layer, e.g. made of Amonil with n~1.5 or PMMA with n~1.5, which separates the active layers of the OLED from the nanostructured waveguide. Depending on the refractive index of this layer, the layer thickness must be chosen so large that the evanescent light from the waveguide decays to a small fraction (e.g. <1%). Typically, layer thicknesses of approx. 300-500 nm are used here. This layer would preferably have to be transparent both for the photoluminescent light and for the OLED excitation light. This layer can also be produced from the liquid phase or coated in a vacuum process.

Above the spacer layer, the OLED can be processed from the liquid phase, in a vacuum process, or in a combination of both. In this case, the lower electrode must or should particularly preferably be designed to be partially transparent. Due to the underlying layers, indium tin oxide (ITO), which is typically applied by cathode sputtering, is not suitable here. ITO coating by cathode sputtering usually results in high temperatures on the substrate (>100° C.). Since the glass transition temperature of many organic semiconductors is lower, the ITO coating could adversely affect the morphology of the underlying layers and thus their functionality. Furthermore, in a reactive coating process, oxygen gas is introduced, which can lead to oxidation of the underlying organic layers. Instead, thin, partially transparent metal layers or conductive polymers such as PEDOT:PSS (poly-3,4-ethylenedioxythiophene: polystyrene sulfonate) with carbon nanotubes are to be used. The organic transport, blocking and emission layers can then be applied to the partially transparent electrode. The wavelength of the emission of the OLED should match the absorption of the photoluminescence layer, for example max. OLED emission at ~470 nm, max. absorption of the fluorescent dye at ~470 nm, max. photoluminescence emission at ~620 nm. The specific wavelengths of the emission maxima can be selected in particular to match the lattice period or lattice constant.

The OLED is completed with a second metal electrode, which can be thicker and non-transparent. In order to avoid degradation of the component by atmospheric oxygen from the top, it is sealed with an encapsulation made of glass or plastic. Since the emission takes place through the substrate, there are no special requirements for the encapsulation materials.

The entire layered structure can be fabricated on the nanostructured substrate in liquid phase processes. It therefore offers great potential for cost-effective roll-to-roll production.

BRIEF DESCRIPTION OF THE SEVERAL VIEWS OF THE DRAWINGS

An exemplary embodiment of the invention is described below with reference to the accompanying drawing described in the description of the figures, which is intended to explain the invention and is not to be viewed as limiting.

FIG. 1 shows an OLED waveguide arrangement 1 according to the invention.

DETAILED DESCRIPTION OF THE INVENTION

The advantages of the OLED waveguide arrangement lie in an improved decoupling efficiency through the combination of an organic light-emitting diode arrangement 11 with a photoluminescence layer containing waveguide layer 13 as well as a defined emission characteristic due to a nanostructured waveguide layer 13.

The OLED waveguide arrangement 1 is constructed in a layer stack. From top to bottom, the FIGURE shows an organic light emitting diode assembly 11, a spacer layer 12, a waveguide layer 13 and a substrate 14.

The organic light-emitting diode arrangement 11 serves as the primary light source.

The spacer layer 12 separates the active layers of the organic light-emitting diode arrangement 11 from the nanostructured waveguide layer 13. The spacer layer 12 is transparent to both the luminescent light and the light from the organic light-emitting diode arrangement 11.

The waveguide layer 13 has a nanostructure and either consists of luminescent material itself or has a layer of luminescent material placed in front of it. The luminescent layer has the function of a wavelength converter. The refractive index of waveguide layer 13 is higher than that of substrate 14 and spacer layer 12.

The substrate 14 consists of plastic or glass and has pixel-dependent nanostructures on the surface. It represents at least the outer side of the arrangement on the light exit surface and protects the organic light-emitting diode arrangement from mechanical contact or the influence of oxygen from the underside.

REFERENCE LIST

1 OLED waveguide assembly
11 organic light emitting diode assembly
12 spacer layer
13 waveguide layer
14 substrate

The invention claimed is:

1. An OLED waveguide assembly (1) comprising an organic light emitting diode assembly (11), a waveguide layer (13) and a substrate (14), wherein
   the organic light emitting diode assembly (11) is separated from the waveguide layer by a spacer layer (12),
   the organic light-emitting diode assembly (11), the spacer layer (12), the waveguide layer (13) and the substrate (14) are materially interconnected in a layer stack,
   the emission of the organic light-emitting diode assembly (11) has maximum emission at a wavelength of around 470 nanometers,
   the waveguide layer (13) is nanostructured,
   the waveguide layer (13) and the spacer layer (12) are made of organic material,
   the spacer layer (12) is transparent to light from the organic light-emitting diode assembly (11) and light from the waveguide layer (13),
   the organic light-emitting diode assembly (11) is a primary light source,
   the substrate (14) has pixel-dependent nanostructures on the surface, which nanostructures can be identical pixel by pixel or slightly different, which are formed with a lattice constant of approximately 400±50 nanometers to match the emissions of the waveguide layer (13),
   the spacer layer (12) has a layer thickness of 300 to 500 nanometers, the waveguide layer (13) itself consists of luminescent material or has a layer made of luminescent material situated in front,
   the waveguide layer (13) or the layer situated in front of the waveguide has the function of a wavelength converter with maximum absorption around 470 nanometers and with maximum emission around 620 nanometers, and
   the substrate (14) is the outer side of the assembly at the light exit surface, or
   the substrate (14) is the outer side of the assembly at the light exit surface and additionally a wavelength-selective (dichroic) layer and/or a long-pass filter is integrated into the layer stack on the light exit surface.

2. The OLED waveguide arrangement (1) according to claim 1, wherein the waveguide layer (13) is completely nanostructured.

3. The OLED waveguide arrangement (1) according to claim 1, wherein the waveguide layer (13) has the nanostructuring on the side facing the substrate (14).

4. The OLED waveguide arrangement (1) according to claim 1, wherein the nanostructures on the waveguide layer (13) are laid out pixel by pixel, wherein the nanostructures on the waveguide layer (13) are identical pixel by pixel or are slightly different by pixel.

5. The OLED waveguide arrangement (1) according to claim 1, wherein the refractive index of the waveguide layer (13) is higher than that of the substrate (14) and spacer layer (12).

6. The OLED waveguide arrangement (1) according to claim 1, wherein the organic light-emitting diode assembly (11) is in the form of thin, partially transparent metal layers and/or conductive polymers and/or poly-3,4-ethylenedioxythiopene and/or polystyrene sulfonate with carbon nanotubes.

7. The OLED waveguide arrangement (1) according to claim 1, wherein the luminescent material of the waveguide layer (13) has a layer thickness at which the primary light is almost completely absorbed.

8. The OLED waveguide arrangement (1) according to claim 1, wherein the waveguide layer (13) and/or spacer layer (12) are formed from at least one of (2-{(E)-2-[4-(dimethylamino)phenyl]vinyl}-6-methyl-4H-pyran-4-ylidene) malononitrile for doping in polyvinylcarbazole, tris-(4,7-diphenyl-1,10-phenanthropon) ruthenium (II) dichloride in polymethyl methacrylate and Super Yellow as a polymer without a separate matrix.

9. An OLED waveguide assembly production method for an OLED waveguide assembly (1) according to claim 1, comprising the steps of:
   producing a substrate (14) with a pixel-dependent nanostructure on the surface by injection molding in plastic or by applying a photoresist layer on the substrate (14) and structuring with the aid a nano-imprinting process;
   applying a waveguide layer containing a photoluminescent layer by liquid phase coating or evaporation or sputtering, wherein one material serves both purposes or two separate materials are used;
   applying a spacer layer (12), which separates the active layers of the organic light emitting diode assembly (11) from the nanostructured waveguide;
   processing the organic light-emitting diode assembly (11) above the spacer layer (12) from a liquid phase and/or in a vacuum process,
   wherein the processing step includes that a lower electrode of the organic light-emitting diode assembly (11) is partially transparent and to this partially transparent electrode there are applied organic transport, blocking and emission layers, wherein the organic light-emitting diode assembly (11) is closed with a second metal electrode, which can be thicker and non-transparent, and wherein the upper side of the organic light-emitting diode arrangement, the side facing away from the emission of the radiation, is sealed by encapsulation with glass or plastic.

* * * * *